United States Patent
Matsumoto et al.

(10) Patent No.: US 9,850,132 B2
(45) Date of Patent: Dec. 26, 2017

(54) METHOD FOR GROWING CARBON NANOTUBES

(71) Applicant: TOKYO ELECTRON LIMITED, Minato-ku, Tokyo (JP)

(72) Inventors: Takashi Matsumoto, Nirasaki (JP); Kenjiro Koizumi, Nirasaki (JP)

(73) Assignee: TOKYO ELECTRON LIMITED, Minato-Ku, Tokyo (JP)

( * ) Notice: Subject to any disclaimer, the term of this patent is extended or adjusted under 35 U.S.C. 154(b) by 12 days.

(21) Appl. No.: 14/779,577

(22) PCT Filed: Mar. 26, 2014

(86) PCT No.: PCT/JP2014/059701
§ 371 (c)(1),
(2) Date: Sep. 24, 2015

(87) PCT Pub. No.: WO2014/157738
PCT Pub. Date: Oct. 2, 2014

(65) Prior Publication Data
US 2016/0046492 A1    Feb. 18, 2016

(30) Foreign Application Priority Data
Mar. 28, 2013  (JP) .................................. 2013-070187

(51) Int. Cl.
*H01L 21/44*      (2006.01)
*C01B 31/02*     (2006.01)
(Continued)

(52) U.S. Cl.
CPC ......... *C01B 31/024* (2013.01); *B01J 35/0013* (2013.01); *B01J 37/349* (2013.01);
(Continued)

(58) Field of Classification Search
CPC ......... B82Y 30/00; B82Y 40/00; C23C 16/02; C23C 16/26; C23C 4/04; H01J 37/32422;
(Continued)

(56) References Cited

U.S. PATENT DOCUMENTS

| | | | | |
|---|---|---|---|---|
| 2005/0266605 A1* | 12/2005 | Kawakami | ............. | B82Y 10/00 438/99 |
| 2007/0099438 A1* | 5/2007 | Ye | .......................... | C23C 14/345 438/778 |
| 2010/0209704 A1* | 8/2010 | Yamazaki | .............. | B82Y 30/00 428/368 |

FOREIGN PATENT DOCUMENTS

| | | |
|---|---|---|
| JP | 2010-163331 A | 7/2010 |
| JP | 2011068513 A * | 4/2011 |

OTHER PUBLICATIONS

International Search Report form PCT/ISA/210 (second sheet) dated Jun. 10, 2014 for PCT/JP/2014/059701.

* cited by examiner

*Primary Examiner* — Charles Garber
*Assistant Examiner* — Abdulfattah Mustapha
(74) *Attorney, Agent, or Firm* — Nath, Goldberg & Meyer; Jerald L. Meyer

(57) ABSTRACT

Provided is a method for growing carbon nanotubes that enables the growth of high-density carbon nanotubes. A high frequency bias voltage is applied to a loading table on which a wafer W having a catalytic metal layer is mounted to generate a bias potential on the surface of the wafer W, and oxygen plasma is used to micronize the catalytic metal layer to form catalytic metal particles. Thereafter, hydrogen plasma is used to reduce the surface of the catalytic metal particles to form activated catalytic metal particles having an activated surface. By using each activated catalytic metal particles as a nucleus, carbon nanotubes are formed.

5 Claims, 5 Drawing Sheets

(51) Int. Cl.
*B01J 37/34* (2006.01)
*B01J 35/00* (2006.01)
*H01L 21/285* (2006.01)
*H01L 21/768* (2006.01)
*C01B 32/162* (2017.01)
*C01B 32/164* (2017.01)
*B01J 23/46* (2006.01)
*B01J 23/52* (2006.01)
*B01J 23/745* (2006.01)
*B01J 23/75* (2006.01)
*B01J 23/755* (2006.01)

(52) U.S. Cl.
CPC .......... *C01B 32/162* (2017.08); *C01B 32/164* (2017.08); *H01L 21/28556* (2013.01); *H01L 21/76876* (2013.01); *B01J 23/462* (2013.01); *B01J 23/52* (2013.01); *B01J 23/745* (2013.01); *B01J 23/75* (2013.01); *B01J 23/755* (2013.01); *H01L 2221/1094* (2013.01)

(58) Field of Classification Search
CPC ........... H01J 37/32357; C01B 31/0226; Y10T 428/292; B32B 27/02
See application file for complete search history.

High-frequency bias voltage : 35W

High-frequency bias voltage : 0W

METHOD FOR GROWING CARBON NANOTUBES

This is a National Phase Application filed under 35 U.S.C. 371 as a national stage of PCT/JP2014/0509701, filed Mar. 26, 2014, an application claiming the benefit of Japanese Application No. 2013-070187, filed Mar. 28, 2013, the content of each of which is hereby incorporated by reference in its entirety.

TECHNICAL FIELD

The present disclosure relates to a method for growing carbon nanotubes.

BACKGROUND

Carbon nanotubes are expected to be used as the next-generation wiring material which replace Cu mainly used as a wiring material in semiconductor devices since they have excellent characteristics of electrical conductivity (low electrical resistance), thermal conductivity (high heat radiation), and current density resistance (high electromigration tolerance). In particular, since the aforementioned characteristics become apparent when the carbon nanotubes are made to have a high density, arranging the carbon nanotubes at a high density has been strongly demanded.

An arc discharge method, a laser ablation method, a liquid phase method, and a chemical vapor deposition method (hereinafter, referred to as "CVD method") are known as a method for growing carbon nanotubes. The CVD method is preferably used in view of productivity, controllability, and semiconductor process consistency. A catalytic CVD method in which catalytic metal fine particles such as Fe, Co, Ni or the like are formed on a substrate and carbon nanotubes are grown using the catalytic metal fine particles as nuclei is generally used as the CVD method.

In the catalytic CVD method, a method of directly depositing fine particles onto a substrate, such as a sputtering method and an arc plasma gun, or a method of obtaining catalytic metal fine particles by performing plasma processing on a catalytic metal layer is used in order to obtain the catalytic metal fine particles (see, e.g., Patent Document 1).

PRIOR ART DOCUMENTS

Patent Document

Patent Document: Japanese laid-open publication No. 2010-163331

If catalytic metal fine particles are obtained by performing plasma processing onto a catalytic metal layer, however, it is necessary to apply thermal energy to the catalytic metal layer using plasma and to agglomerate the atoms of catalytic metal. However, if the thermal energy provided by the plasma is not so great, the agglomeration of the atoms of the catalytic metal may not be proceeded.

Further, for example, in order to grow high-density carbon nanotubes having an arrangement density of $1 \times 10^{12}$ tubes/$cm^2$ or higher, it is necessary to make the size (diameter) of the catalytic metal fine particles functioning as nuclei into a nano-order size. However, when thermal energy higher than the necessary level is applied to the atoms of the catalytic metal, even if it is slightly higher, the agglomeration is excessively developed to come to form over-sized catalytic metal fine particles. Thus, it is not easy to obtain catalytic metal fine particles of a nano-order size.

That is, there is a problem in that it is difficult to properly form catalytic metal fine particles having sizes required to grow high-density carbon nanotubes and this leads to the difficulty in growing high-density carbon nanotubes.

SUMMARY

The present disclosure provides a method for growing carbon nanotubes which is capable of growing high-density carbon nanotubes.

In accordance with an embodiment of the present disclosure, there is provided a method for growing carbon nanotubes, including: a fine particle forming process of forming catalytic metal fine particles by micronizing a catalytic metal layer using first plasma in a substrate including thereon the catalytic metal layer; an activation process of activating surfaces of the catalytic metal fine particles by reducing the surfaces of the catalytic metal fine particles using second plasma containing hydrogen atoms; and a carbon nanotube forming process of forming the carbon nanotubes using the catalytic metal fine particles having the activated surfaces as nuclei, wherein a bias potential is generated on a surface of the substrate in the fine particle forming process.

In the present disclosure, in the fine particle forming process, the substrate may be loaded on a loading table and a bias voltage may be applied to the substrate via the loading table.

In the present disclosure, the first plasma may include at least oxygen plasma.

In the present disclosure, the first plasma may include at least argon atoms.

In the present disclosure, in the carbon nanotube forming process, a plasma CVD method may be used.

In the present disclosure, in the carbon nanotube forming process, a thermal CVD method may be used.

In the present disclosure, in the carbon nanotube forming process, the bias voltage may not be applied.

In the present disclosure, in the activation process, the bias voltage may not be applied.

In the present disclosure, the fine particle forming process, the activation process, and the carbon nanotube forming process may be sequentially and continuously performed.

In accordance with an embodiment of the present disclosure, when forming the catalytic metal fine particles by micronizing the catalytic metal layer using the first plasma in the substrate including the catalytic metal layer, the bias potential is generated on the surface of the substrate. Accordingly, the amount of ions within the first plasma drawn onto the catalytic metal layer can be controlled by adjusting the bias potential. That is, the amount of thermal energy of an ion flux applied to the catalytic metal layer can be controlled. As a result, as much energy that allows the atoms of catalytic metal to be agglomerated but not excessively agglomerated can be applied to the catalytic metal layer. Accordingly, high-density carbon nanotubes can be grown.

DETAILED DESCRIPTION

Embodiments of the present disclosure will now be described in detail with reference to the accompanying drawings.

Figure 1:
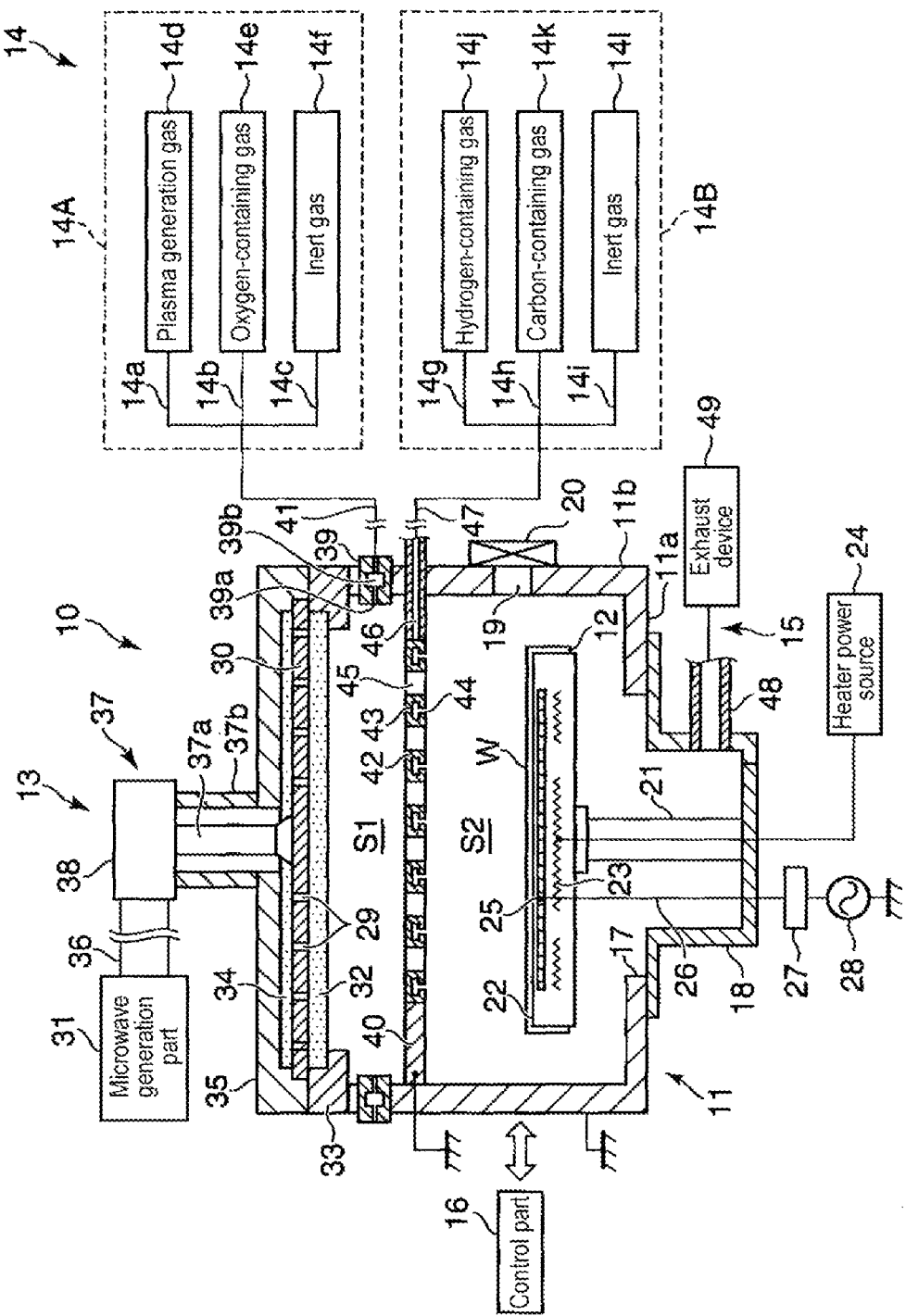
FIG. 1 is a cross-sectional view schematically illustrating the configuration of a plasma CVD film forming apparatus used in a method for growing carbon nanotubes in accordance with an embodiment of the present disclosure.

FIG. 1 is a cross-sectional view schematically illustrating the configuration of a plasma CVD film forming apparatus used in a method for growing carbon nanotubes in accordance with an embodiment of the present disclosure.

The plasma CVD film forming apparatus 10 of FIG. 1 is configured to generate microwave-excited plasma of a high density and a low-electron temperature by introducing microwaves into a chamber 11 through a planar antenna provided with a plurality of slot-shaped holes. Specifically, the plasma CVD film forming apparatus 10 generates microwave-excited plasma having a density of $1 \times 10^{10}$ to $5 \times 10^{12}$/cm$^3$ and an electron temperature of 0.7 to 2 eV.

Since the microwave-excited plasma is low electron temperature plasma mainly including radicals, it does not damage a surface of a target substrate which is processed by the microwave-excited plasma. Thus, the microwave-excited plasma is suitable for pre-processing of carbon nanotubes.

Referring to FIG. 1, the plasma CVD film forming apparatus 10 includes a chamber 11 having an air-tight configuration and an approximately cylindrical shape, a loading table 12 installed within the chamber 11 to mount thereon a semiconductor wafer (hereinafter simply referred to as "wafer") W as a target substrate to be processed, a microwave introduction part 13 introducing microwaves into the chamber 11, a gas supply part 14 supplying gases into the chamber 11, an exhaust part 15 exhausting the interior of the chamber 11, and a control part 16 controlling the elements of the plasma CVD film forming apparatus 10.

A circular opening 17 is formed through the substantially central portion of the bottom wall 11a of the chamber 11. An exhaust chamber 18 which communicates with the interior of the chamber 11 through the opening 17 and which protrudes downwardly in the drawing is installed at the bottom wall 11a. A loading/unloading port 19 through which the wafer W is loaded into or unloaded from the chamber 11 and a gate valve 20 for opening and closing the loading/unloading port 19 are installed in the sidewall 11b of the chamber 11.

The loading table 12 is formed of ceramics, for example, $Al_2O_3$ or AlN, and supported by a cylindrical ceramic post 21 upwardly extending from the lower center of the exhaust chamber 18. A guide ring 22 for guiding the wafer W is installed at the outer periphery of the loading table 12. An elevation pin (not illustrated) for moving up and down the wafer W is installed inside the loading table 12. The elevation pin protrudes above a surface of the loading table 12 to separate the wafer W from the loading table 12.

A resistance heating type heater 23 is embedded in the loading table 12 and heats the wafer W loaded on the loading table 12 when being energized by a heater power source 24. Further, a thermocouple (not illustrated) is inserted into the loading table 12 to measure a temperature of the wafer W. The heater 23 controls the temperature of the wafer W within a range of 50 to 650 degrees C. Hereinafter, the temperature of the wafer W means a temperature measured by the thermocouple not a temperature set in the heater 23, unless specially mentioned. Further, hereinafter, if the temperature of the wafer W can not be directly measured by the thermocouple or the like, the temperature of the loading table 12 is assumed to be the temperature of the wafer W. Further, a heater (not illustrated) may be also installed in the sidewall 11b.

Further, a lower electrode 25 is buried between the heater 23 and the surface of the loading table 12, i.e., at an upper side of the heater 23 within the loading table 12. A high-frequency power source 28 for applying a high-frequency bias voltage is connected to the lower electrode 25 by a feeder line 26 with a matching box 27 interposed therebetween. The lower electrode 25 applies a high-frequency bias (RF bias) voltage to the wafer W using high-frequency power supplied by the high-frequency power source 28.

The material of the lower electrode 25 is preferably a material having the same thermal expansion coefficient as ceramics such as AlN which is the material of the loading table 12. In particular, a conductive material such as molybdenum or tungsten is preferably used. The lower electrode 25 is formed to have a mesh shape, a grid pattern shape, or a vortex shape, for example. The size of the lower electrode 25 is preferably at least equal to that of the wafer or slightly greater than that of the wafer (e.g., about 1 to 5 mm greater than the diameter of the wafer).

The microwave introduction part 13 includes a planar antenna 30 installed at the upper part of the chamber 11 and having a number of microwave radiation holes 29 formed through the planar antenna 30, a microwave generation part 31 generating microwaves, a dielectric window 32 made of a dielectric material, a frame-shaped member 33 installed at the upper part of the chamber 11 below the planar antenna 30, a dielectric plate 34 made of a dielectric material and controlling the wavelength of microwaves, and a cover member 35 which covers the planar antenna 30 and the dielectric plate 34. Further, the microwave introduction part 13 includes a waveguide 36 and a coaxial waveguide 37 which guide the microwaves generated by the microwave generation part 31 to the planar antenna 30, and a mode converter 38 installed between the waveguide 36 and the coaxial waveguide 37.

The dielectric window 32 transmitting the microwaves is made of ceramics such as quartz, $Al_2O_3$, AlN or the like. The dielectric window 32 is supported by the frame-shaped member 33. A seal member (not illustrated) such as an O ring is disposed between the dielectric window 32 and the frame-shaped member 33, so the interior of the chamber 11 is air-tightly maintained by the seal member.

The planar antenna 30 has, e.g., a disk shape and is formed of a conductive member such as a copper plate having a surface plated with gold or silver, an aluminum plate, a nickel plate, a metal alloy or the like. The planar antenna 30 is installed on the dielectric window 32 approximately in parallel with a surface of the loading table 12 on which the wafer W is loaded (loading surface). The planar antenna 30 is engaged with the bottom of the cover member 35. Each of the microwave radiation holes 29 is formed of a rectangular (slot shape) hole. The microwave radiation holes 29 are distributed and arranged in the planar antenna 30 forming a specific pattern. For example, two adjacent microwave radiation holes 29 are combined to form a pair such that they maintain a specific position relation therebetween (e.g., a T shape). The microwave radiation holes 29 forming the pairs are arranged in a concentric circular shape, a spiral shape, a radial shape or the like. The length or arrangement distance of the microwave radiation holes 29 are determined based on the wavelength λg of microwaves.

The dielectric plate 34 having a dielectric constant higher than that in a vacuum is installed on the upper surface of the planar antenna 30. The dielectric plate 34 shortens the wavelength of microwaves under the consideration of an increase in the wavelength of microwaves in a vacuum. For example, quartz, alumina, polytetrafluoroethylene resin, or polyimide resin are used as the material of the dielectric plate 34.

Further, the cover member 35 is made of metal such as aluminum, stainless steel or the like and connected to one end of the coaxial waveguide 37 at the substantial center of the upper surface of the cover member 35. The coaxial waveguide 37 includes an inner conductor 37a extending upward from the center of the planar antenna 30 and an outer conductor 37b which surrounds the inner conductor 37a. The mode converter 38 is connected to the other end of the coaxial waveguide 37. The mode converter 38 is connected to the microwave generation part 31 with the waveguide 36 interposed therebetween. The mode converter 38 converts the microwaves which propagate within the waveguide 36 in TE mode into TEM mode.

The gas supply part 14 includes a shower ring 39 installed in a ring shape along the inner wall of the chamber 11 and a shower plate 40 installed below the shower ring 39 to partition the internal space of the chamber 11 into an upper portion and a lower portion.

The shower ring 39 includes a gas discharge hole 39a which introduces a gas into the internal space of the chamber 11 and a gas passage 39b which communicates with the gas discharge hole 39a. The gas passage 39b is connected to a first gas supply part 14A via a gas supply channel 41. The first gas supply part 14A includes three branch passages 14a, 14b, and 14c branched from the gas supply channel 41. The branch passage 14a is connected to a plasma generation gas supply source 14d for supplying a plasma generation gas. The branch passage 14b is connected to an oxygen-containing gas supply source 14e for supplying an oxygen-containing gas. The branch passage 14c is connected to an inert gas supply source 14f for supplying an inert gas. A mass flow controller or a valve (not illustrated) is installed in each of the branch passages 14a, 14b, and 14c.

For example, a noble gas may be used as the plasma generation gas. For example, a gas of Ar, Ne, Kr, Xe, or He may be used as the noble gas. In particular, the Ar gas is preferably used since it can generate plasma cheaply and stably. For example, a gas of $O_2$, $H_2O$, $O_3$, or $N_2O$ may be used as the oxygen-containing gas. For example, an $N_2$ gas may be used as the inert gas. The inert gas supplied by the inert gas supply source 14f is used as a purge gas or a gas for controlling pressure, for example.

The shower plate 40 includes a gas distribution member (grid) 42 made of, e.g., aluminum, and formed to have a lattice shape when viewed in a plan view. The grid 42 includes a gas passage 43 formed inside the grid and a number of gas discharge holes 44 opened from the gas passage 43 such that they face the loading table 12. Further, the grid 42 includes a number of through holes 45. A gas supply tube 46 penetrating the sidewall of the chamber 11 is connected to the gas passage 43 of the shower plate 40. The gas supply tube 46 is connected to a second gas supply part 14B via a gas supply channel 47. The second gas supply part 14B includes three branch passages 14g, 14h, and 14i branched from the gas supply channel 47. The branch passage 14g is connected to a hydrogen-containing gas supply source 14j for supplying a hydrogen-containing gas. The branch passage 14h is connected to a carbon-containing gas supply source 14k for supplying a carbon-containing gas which is the raw materials for carbon nanotubes. The branch passage 14i is connected to an inert gas supply source 14l for supplying an inert gas. Further, a mass flow controller or a valve (not illustrated) is installed in each of the branch passages 14g, 14h, and 14i. Further, gases supplied by the second gas supply part 14B are collectively hereinafter referred to as a process gas. Further, the shower plate 40 may be made of ceramics such as quartz, alumina or the like. If the shower plate 40 is made of metal such as aluminum, a ceramic film may be provided on a surface of the shower plate 40. Further, the shape of the shower plate 40 is not limited to the grid shape, but may be a ring shape.

For example, an $H_2$ gas or an $NH_3$ gas is used as the hydrogen-containing gas. For example, a gas such as ethylene ($C_2H_4$), methane ($CH_4$), ethane ($C_2H_6$), propane ($C_3H_8$), propylene ($C_3H_6$), acetylene ($C_2H_2$), methanol ($CH_3OH$), and ethanol ($C_2H_5OH$) is used as the carbon-containing gas. For example, an $N_2$ gas is used as the inert gas. The inert gas supplied from the inert gas supply source 14l is used as a purge gas or a carrier gas, for example.

The exhaust part 15 includes the exhaust chamber 18, the exhaust pipe 48 opened at the side surface of the exhaust chamber 18, and an exhaust device 49 connected to the exhaust pipe 48. The exhaust device 49 is equipped with a high-speed vacuum pump such as a turbo molecular pump. In the exhaust part 15, when the exhaust device 49 is energized, gases within the chamber 11 uniformly flow into the internal space of the exhaust chamber 18 and are also discharged from the internal space to the outside through the exhaust pipe 48. Accordingly, the interior of the chamber 11 can be rapidly depressurized up to 0.133 Pa, for example.

In the plasma CVD film forming apparatus 10, plasma is generated in the space S1 of the chamber 11 between the dielectric window 32 through which the microwaves are introduced and the shower plate 40 by introducing the plasma generation gas from the shower ring 39. In this case, since the generated plasma behaves as metal with respect to the microwaves, the plasma (surface wave plasma) is generated near the bottom of the dielectric window 32. The generated plasma is diffused into a space S2 between the shower plate 40 and the loading table 12. Accordingly, the electron temperature of the plasma in the space S2 is lower than that of the plasma in the space S1. That is, in the plasma CVD film forming apparatus 10, if the process gas is introduced from the shower plate 40 to the space S2, excessive divergence of the process gases can be suppressed and damage to the wafer W can be reduced since the electron temperature of the plasma is lowered. Further, a modification effect by radicals may be also expected since many radicals are present in the plasma generated by excitation of microwaves.

Figure 2:
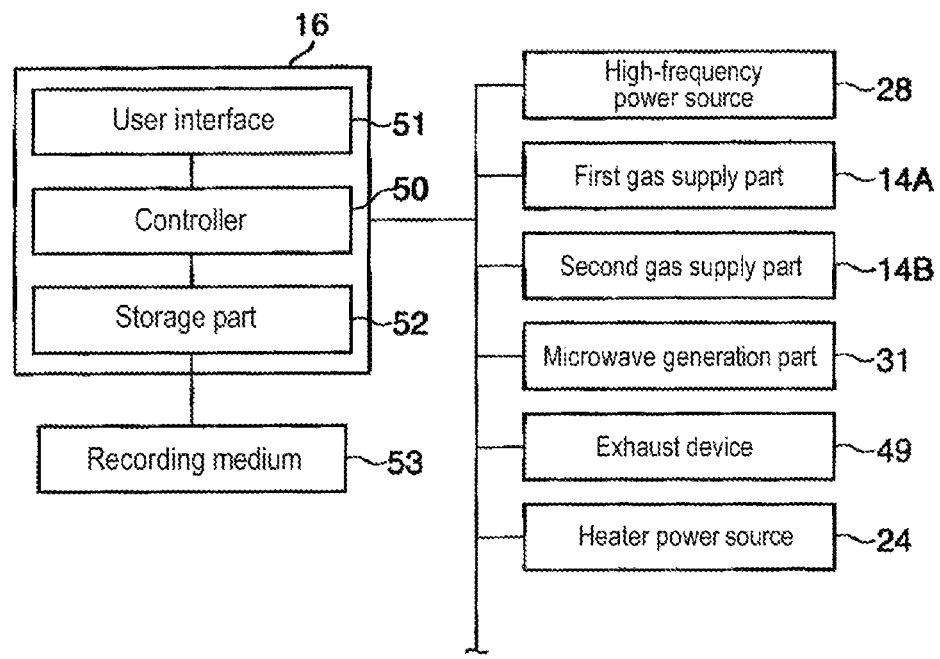
FIG. 2 is a block diagram schematically illustrating the configuration of a control part in FIG. 1.

The control part 16 is a module controller for controlling the operation of each of the elements of the plasma CVD film forming apparatus 10. The control part 16 is typically a computer and includes, e.g., a controller 50 equipped with a CPU and a user interface 51 and a storage part 52 which are connected to the controller 50, as illustrated in FIG. 2.

In the plasma CVD film forming apparatus 10, the controller 50 controls the elements (e.g., the high-frequency power source 28 for applying bias voltage, the heater power source 24, the first gas supply part 14A, the second gas supply part 14B, the microwave generation part 31, and the exhaust device 49) related to various processing conditions such as a temperature, pressure, a gas flow rate, microwave output, and high-frequency output for applying the bias voltage.

The user interface 51 includes a keyboard or a touch panel to which an operator inputs commands for manipulating the plasma CVD film forming apparatus 10 and a display for visualizing and displaying the operative state of the plasma CVD film forming apparatus 10. Further, the storage part 52 stores recipes in which control programs (software) or processing condition data for realizing various processes performed in the plasma CVD film forming apparatus 10 under the control of the controller 50 are recorded.

Further, the control part 16 calls out an arbitrary recipe from the storage part 52 according to the instructions or the like from the user interface 51 and allows the recipe to be executed by the controller 50. In this case, desired processes, for example, processes corresponding to a method for growing carbon nanotubes shown in FIG. 3, which will be described later, are performed in the chamber 11 of the plasma CVD film forming apparatus 10.

Further, the recipes in which the control programs or the processing condition data are recorded may be stored in a computer-readable recording medium 53. As the recording medium 53, it may be possible to use, e.g., a CD-ROM, a hard disc, a flexible disc, a flash memory, or the like. Moreover, the recipes may be transmitted from other devices through, e.g., a dedicated line.

A method for growing carbon nanotubes in accordance with an embodiment of the present disclosure is described below.

Figure 3:
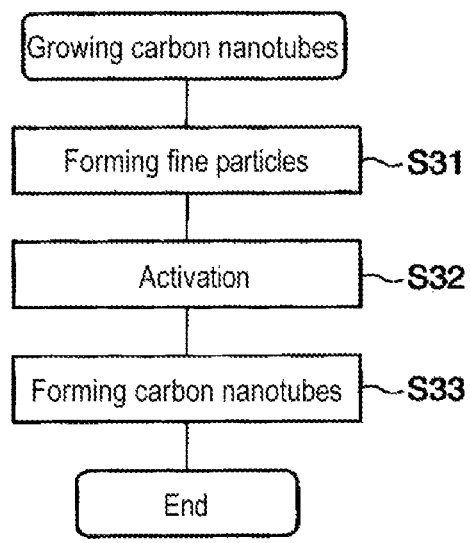
FIG. 3 is a flowchart illustrating a method for growing carbon nanotubes according to the present embodiment.

FIG. 3 is a flowchart illustrating a method for growing carbon nanotubes according to the present embodiment, and FIGS. 4A to 4D are diagrams of the processes in the method for growing carbon nanotubes shown in FIG. 3.

As illustrated in FIG. 3, the method for growing carbon nanotubes according to the present embodiment includes a fine particle forming step S31 of forming catalytic metal fine particles 57A by micronizing a catalytic metal layer 57, an activation step S32 of activating the surfaces of the formed catalytic metal fine particles 57A by reducing the surfaces, and a carbon nanotube forming step S33 of forming carbon nanotubes 58 using the activated catalytic metal fine particles 57B having the activated surfaces as nuclei, respectively.

In the method for growing carbon nanotubes according to the present embodiment, in the fine particle forming step S31, an $O_2$ gas is used as the oxygen-containing gas. In the activation step S32, an $H_2$ gas is used as the hydrogen-containing gas. In the carbon nanotube forming step S33, an $N_2$ gas is used as the inert gas, and a $C_2H_4$ gas is used as the carbon-containing gas. In each step, an Ar gas is used as the plasma generation gas. Further, the Ar gas is also used to control the partial pressure of the oxygen-containing gas or the inert gas supplied by the first gas supply part 14A.

Figure 4A:
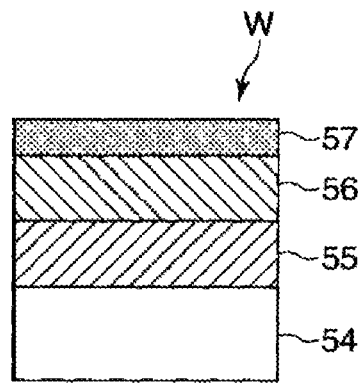
FIGS. 4A to 4D are diagrams of processes in the method for growing carbon nanotubes in FIG. 3.

Further, in the method for growing carbon nanotubes according to the present embodiment, the wafer W including a base layer 55 laminated on a silicon substrate 54, a base layer 56 laminated on the base layer 55, and a catalytic metal layer 57 laminated on the base layer 56, as illustrated in FIG. 4A, is used.

In the wafer W, both the base layers 55 and 56 function as films for preventing coarsening attributable to the agglomeration of the catalytic metal. For example, Al, Ti, $Al_2O_3$, TiN, Ta, TaN, or $SiO_2$ is used as the material of the base layer. The base layers 55 and 56 are formed by well-known film forming technologies such as sputtering, a deposition method, a CVD method, plating or the like. The thickness of each of the base layers 55 and 56 is preferably 5 to 100 nm, for example. Further, the laminated number of the base layers is not limited to two layers, but may be a single layer. Further, an arbitrary layer such as an insulating layer may be placed under the base layers 55 and 56.

The catalytic metal layer 57 is a metal layer from which the catalytic metal fine particles serving as nuclei for forming carbon nanotubes are formed. Transition metal such as Fe, Co, Ni, Ru, Au or the like, or an alloy including the transition metal is included as the metal forming the catalytic metal layer 57. The catalytic metal layer 57 is formed by well-known film forming technologies such as sputtering, a deposition method, a CVD method, plating or the like. The thickness of the catalytic metal layer 57 is preferably 0.1 to 5 nm, for example, since it influences the size of catalytic metal fine particles formed in the fine particle forming step S31.

Further, the wafer W may be a glass substrate or a plastic (polymer) substrate other than a silicon substrate.

In the method for growing carbon nanotubes according to the present embodiment, the wafer W is first prepared and is loaded from the loading/unloading port 19 into the chamber 11 by opening the gate valve 20 of the plasma CVD film forming apparatus 10. The wafer W is finally loaded on the loading table 12.

Next, in the fine particle forming step S31, while the wafer W loaded on the loading table 12 is heated, oxygen plasma processing is performed to the catalytic metal layer 57 and the high-frequency bias voltage is applied to the wafer W.

Figure 4B:
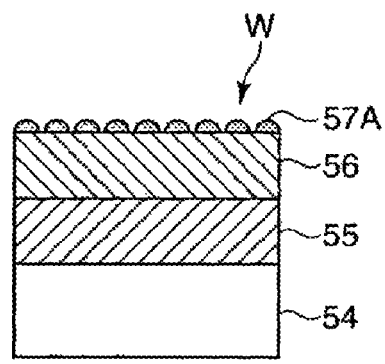

Specifically, while the Ar gas and the $O_2$ gas are introduced from the shower ring 39 into the chamber 11, microwaves generated by the microwave generation part 31 are guided to the planar antenna 30 through the waveguide 36 and the coaxial waveguide 37 in a TEM mode and then introduced into the chamber 11 through the microwave radiation holes 29 of the planar antenna 30 and the dielectric window 32. The introduced microwaves generate plasma from the Ar gas and the $O_2$ gas. In particular, oxygen plasma (first plasma) generated from the $O_2$ gas performs oxygen plasma processing on the catalytic metal layer 57 of the wafer W to change the catalytic metal layer 57 into a number of catalytic metal fine particles 57A (FIG. 4B).

Further, at this time, the high-frequency bias voltage is applied to the wafer W by supplying high-frequency power of a predetermined frequency output from the high-frequency power source 28 to the lower electrode 25 of the loading table 12. The high-frequency bias voltage generates a bias potential on a surface of the wafer W and draws ions of the oxygen plasma onto the surface of the wafer W, in particular, toward the catalytic metal layer 57. The amount of ions (the amount of an ion flux) drawn onto the catalytic metal layer 57 can be controlled by adjusting the value of the applied high-frequency bias voltage (i.e., the bias potential generated on the surface of the wafer W).

In the fine particle forming step S31, the atoms of catalytic metal become easy to move since impurities such as organic materials attached to the surface of the catalytic metal layer 57 are removed by the radicals of the oxygen plasma. Further, thermal energy is provided to the catalytic metal layer 57 due to a collision with the ions of the oxygen plasma and heating from the loading table 12. As a result, migration attributable to the heating occurs on the surface of the catalytic metal layer 57 and the agglomeration of meal atoms forming the catalytic metal layer 57 is generated, so that micronizing is proceeded. As described above, in the fine particle forming step S31, energy capable of generating the migration of the atoms of the surface in the catalytic metal layer 57 is provided by the ions in the oxygen plasma and by heating from the loading table 12. Accordingly, a number of island-shape particles which are formed by the agglomeration of the plurality of the atoms of the catalytic metal, are generated, thereby changing the catalytic metal layer 57 into a number of catalytic metal fine particles 57A.

In this case, if the amount of ions in the oxygen plasma that collide against the catalytic metal layer 57 are small, migration is not generated on the surface of the catalytic metal layer 57. If the amount of ions in the oxygen plasma that collide against the catalytic metal layer 57 are large, the atoms of the catalytic metal are excessively agglomerated, and thus the size of the formed catalytic metal fine particles 57A becomes bigger than necessary.

To cope with this problem, in the method for growing carbon nanotubes according to the present embodiment, the high-frequency bias voltage is applied to the wafer W and the amount of the ion flux drawn onto the catalytic metal layer 57 is controlled by adjusting the value of the applied high-frequency bias voltage. Accordingly, the amount of thermal energy of the ion flux applied to the catalytic metal layer 57 can be controlled. Specifically, as much energy that allows the atoms of the catalytic metal to be agglomerated but not excessively agglomerated can be applied to the catalytic metal layer 57. As a result, a number of catalytic metal fine particles 57A of a nano-order size required to grow high-density carbon nanotubes can be obtained.

Figure 5:
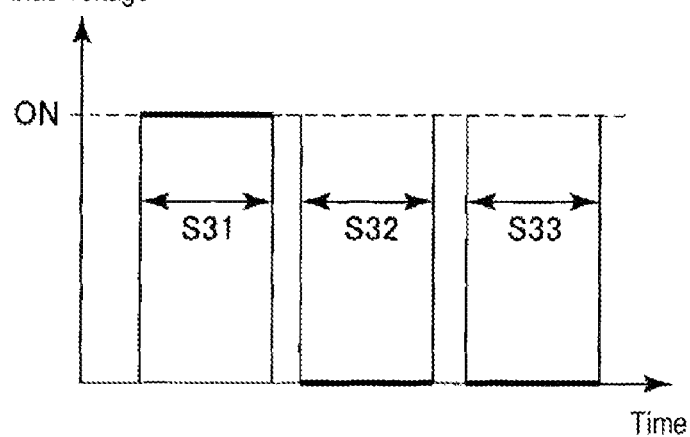
FIG. 5 is a timing chart of the application of a high-frequency bias voltage in the method for growing carbon nanotubes in FIG. 3.

Further, in the method for growing carbon nanotubes according to the present embodiment, in the activation step S32 or the carbon nanotube forming step S33 other than the fine particle forming step S31, the high-frequency bias voltage is not applied to the wafer W, as illustrated in a timing chart of FIG. 5.

Further, when the ions of the oxygen plasma are drawn onto the catalytic metal layer 57 by applying the high-frequency bias voltage to the wafer W, a number of high energy portions are generated on the surface of the catalytic metal layer 57 due to the collision with the ions. In this case, since the atoms of the catalytic metal are agglomerated around the high energy portions as nuclei, high density catalytic metal fine particles 57A can be obtained by forming a number of catalytic metal fine particles 57A.

Further, when the ions of the oxygen plasma are drawn onto the catalytic metal layer 57, the surfaces of the formed catalytic metal fine particles 57A are oxidized to form oxide films, thereby suppressing additional agglomeration between the catalytic metal fine particles 57A. Accordingly, the size of the catalytic metal fine particle 57A can be prevented from becoming larger than required.

In the plasma CVD film forming apparatus 10, the electron temperature of the plasma can be kept low. Thus, even if the ions in the oxygen plasma are drawn onto the catalytic metal layer 57 by applying the high-frequency bias voltage to the wafer W, damage to the catalytic metal layer 57 can be suppressed.

In the fine particle forming step S31, the frequency of the high-frequency power supplied by the high-frequency power source 28 is preferably within a range, e.g., from 400 kHz or more to 60 MHz or less, and more preferably within a range from 450 kHz or more to 20 MHz or less. The high-frequency power is applied such that output density per area of the wafer W is preferably within a range, e.g., from 0.012 W/cm$^2$ or more to 0.585 W/cm$^2$ or less, and more preferably within a range from 0.012 W/cm$^2$ or more to 0.234 W/cm$^2$ or less. Further, the output value of the high-frequency power is preferably within a range from 10 W or more to 500 W or less, and more preferably within a range from 10 W or more to 200 W or less.

The size of the catalytic metal fine particle 57A formed in the fine particle forming step S31 is preferably within a range, e.g., from about 1 to 50 nm. As the initial film thickness of the catalytic metal layer 57 is thinner, the size of the island is reduced, and thus the diameter of the catalytic metal fine particle 57A is also reduced. For example, when the catalytic metal layer 57 has the film thickness of 1 nm, the diameter of a formed catalytic metal fine particle 57A is about 10 nm. When the catalytic metal layer 57 has the film thickness of 2 nm, the diameter of a formed catalytic metal fine particle 57A is about 20 nm.

In the fine particle forming step S31, if the temperature of the wafer W is less than 100 degrees C., the catalytic metal layer 57 is not sufficiently micronized. If the temperature of the wafer W exceeds 600 degrees C., there is a possibility that the size of the catalytic metal fine particle 57A may become excessively increased since agglomeration of the catalytic metal fine particles 57A are proceeded. Accordingly, the temperature of the wafer W is preferably within a range, e.g., from 100 to 600 degrees C., and more preferably within a range from 250 to 500 degrees C.

The pressure within the chamber 11 is preferably within a range, e.g., from 66.7 to 400 Pa (0.5 to 3 Torr), and more preferably within a range from 133 to 266 Pa from a viewpoint of producing more radicals in the oxygen plasma.

The flow rate of the O$_2$ gas is preferably within a range, e.g., from 50 to 500 mL/min (sccm) and more preferably within a range from 100 to 200 mL/min (sccm) from a viewpoint of suppressing the catalytic metal fine particles 57A from being oxidized more than required. Further, the flow rate of the Ar gas is preferably within a range, e.g., from 100 to 2000 mL/min (sccm) and more preferably within a range from 300 to 1000 mL/min (sccm) from a viewpoint of increasing the efficiency in generating radicals within the plasma.

The output value of the introduced microwaves is preferably within a range, e.g., from 500 W to 4000 W and more preferably within a range from 500 W to 3000 W from a viewpoint of efficiently generating the radicals within the plasma and of enabling to form the carbon nanotubes at low temperature in the carbon nanotube forming step S33 to be described later in detail.

The processing time is preferably within a range, e.g., from 1 minute to 20 minutes and more preferably within a range from 5 minutes to 10 minutes from a viewpoint of optimally changing the catalytic metal layer 57 into the catalytic metal fine particles 57A.

When the fine particle forming step S31 is terminated, the introduction of the microwaves is first stopped, the application of the high-frequency bias voltage is stopped, and the supply of the O$_2$ gas is stopped. Further, in the fine particle forming step S31, various oxygen-containing gases such as H$_2$O, O$_3$, N$_2$O or the like may be used as the gas for generating the oxygen plasma instead of the O$_2$ gas.

Next, in the activation step S32, the catalytic metal fine particles 57A are activated by reducing the surface of each of the catalytic metal fine particles 57A formed in the fine particle forming step S31 by hydrogen plasma.

Figure 4C:
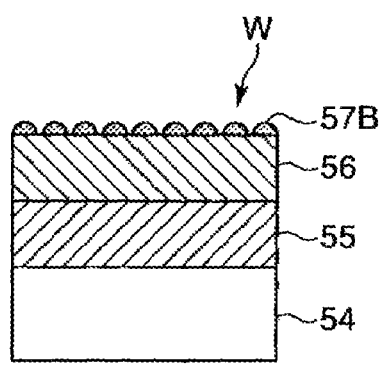

Specifically, after the fine particle forming step S31 is terminated, while the Ar gas continues to be introduced, microwaves generated by the microwave generation part 31 are introduced to the interior of the chamber 11, similarly to the fine particle forming step S31. The introduced microwaves generate argon plasma from the Ar gas. When the argon plasma is generated, an $H_2$ gas is introduced to the interior of the chamber 11 through the shower plate 40 and is excited by the argon plasma, thereby generating hydrogen plasma (second plasma). Radicals within the generated hydrogen plasma perform hydrogen plasma processing on the surfaces of the catalytic metal fine particles 57A to reduce the oxide films (not illustrated) on the surfaces of the catalytic metal fine particles 57A. As a result, the catalytic metal fine particles 57A are changed into activated catalytic metal fine particles 57B (FIG. 4C). Further, although the Ar gas continues to be introduced over a period from the fine particle forming step S31 to the activation step S32 in the present embodiment, other plasma generation gases may be introduced in the activation step S32 after the fine particle forming step S31 is terminated and the introduction of the Ar gas is stopped.

If the temperature of the wafer W in the activation step S32 is less than 100 degrees C., the surfaces of the catalytic metal fine particles 57A are not sufficiently activated since the oxide films on the surfaces of the catalytic metal fine particles 57A are not sufficiently reduced. If the temperature of the wafer W in the activation step S32 exceeds 600 degrees C., there is a possibility that the size of the activated catalytic metal fine particles 57B may be excessively increased since new agglomerations of the catalytic metal fine particles 57A are proceeded. Accordingly, the temperature of the wafer W in the activation step S32 is preferably within a range, e.g., from 100 to 600 degrees C. and more preferably within a range from 250 to 500 degrees C.

The pressure within the chamber 11 is preferably within a range, e.g., from 66.7 to 400 Pa (0.5 to 3 Torr) and more preferably within a range from 66.7 to 133 Pa from a viewpoint of producing more radicals within the hydrogen plasma.

The flow rate of the $H_2$ gas is preferably within a range, e.g., from 100 to 2000 mL/min (sccm) and more preferably within a range from 300 to 1500 mL/min (sccm) from a viewpoint of efficiently producing the radicals in the plasma. Further, the flow rate of the Ar gas is preferably within a range, e.g., from 100 to 2000 mL/min (sccm) and more preferably within a range from 300 to 1000 mL/min (sccm) from a viewpoint of increasing efficiency in generating the radicals in the plasma.

The output value of the introduced microwaves is preferably within a range, e.g., from 500 W to 4000 W, similarly to the fine particle forming step S31, and more preferably within a range from 500 W to 3000 W, from a viewpoint of efficiently generating the radicals within the plasma and enabling to form the carbon nanotubes at a low temperature in the carbon nanotube forming step S33.

The processing time is preferably within a range, e.g., from 1 minute to 15 minutes and more preferably within a range from 5 minutes to 10 minutes from a viewpoint of activating the surfaces of the catalytic metal fine particles 57A while suppressing the agglomeration of the catalytic metal fine particles 57A.

When the activation step S32 is terminated, the introduction of the microwaves is first stopped, and the supply of the $H_2$ gas is stopped. Further, in the activation step S32, a hydrogen-containing gas such as an $NH_3$ gas or the like may be used as the gas for generating the hydrogen plasma instead of the $H_2$ gas. Further, a mixed gas of the $H_2$ gas and the $NH_3$ gas may be used as the gas for generating the hydrogen plasma.

Next, in the carbon nanotube forming step S33, the carbon nanotubes 58 are formed using the respective activated catalytic metal fine particles 57B having the activated surface as nucleus.

Figure 4D:
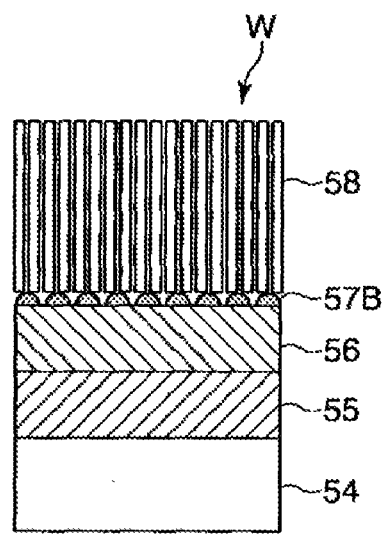

Specifically, after the activation step S32, while the Ar gas continues to be introduced, an $N_2$ gas and a $C_2H_4$ gas are introduced into the interior of the chamber 11 through the shower plate 40. At this time, the $N_2$ gas functions as a carrier gas. Further, the $C_2H_4$ gas is thermally decomposed to generate carbon atoms. The carbon nanotubes 58 are formed using the generated carbon atoms such that each of the activated catalytic metal fine particles 57B serves as the nucleus (FIG. 4D). At this time, the plasma CVD film forming apparatus 10 functions as a thermal CVD apparatus for forming the carbon nanotubes using a thermal CVD method. Further, although the Ar gas continues to be introduced from the activation step S32 to the carbon nanotube forming step S33, other gases may be introduced in order to control, e.g., a partial pressure, after the activation step S32 is terminated and the introduction of the Ar gas is stopped. Further, the heater installed within the loading table 12 or the sidewall 11b, or a halogen lamp may be used as the heating source for the thermal CVD method. Further, the wafer W or the like may be heated through the molecular vibration by introducing microwaves in a state where the plasma is not generated.

In forming the carbon nanotubes 58 using the thermal CVD method (in the carbon nanotube forming step S33), the temperature of the wafer W is preferably within a range, e.g., from 300 degrees C. to 550 degrees C. and more preferably within a range from 300 degrees C. to 500 degrees C. from a viewpoint of realizing a low temperature process. In particular, in the method for growing carbon nanotubes according to the present embodiment, since an environment suitable for forming the carbon nanotubes is realized within the chamber 11 by previously performing the fine particle forming step S31 and the activation step S32 prior to the carbon nanotube forming step S33, the carbon nanotubes 58 can be formed at a low temperature of 550 degrees C. or less, preferably a temperature range from 300 degrees C. to 550 degrees C. Further, the temperature of the wafer W in the carbon nanotube forming step S33 may be different from or the same as the temperature of the wafer W in the activation step S32. If the temperature of the wafer W in the carbon nanotube forming step S33 is the same as that in the activation step S32, throughput can be improved.

Further, the pressure within the chamber 11 is preferably within a range, e.g., from 66.7 to 667 Pa (0.5 to 5 Torr) and more preferably within a range from 400 Pa to 667 Pa from a viewpoint of maintaining a sufficient growth rate of the carbon nanotubes.

The flow rate of the $C_2H_4$ gas is preferably within a range, e.g., from 5 to 200 mL/min (sccm) and more preferably within a range from 6 to 30 mL/min (sccm) from a viewpoint of efficiently growing the carbon nanotubes 58.

Further, the growth rate of the carbon nanotubes 58 can be larger and the carbon nanotubes 58 can have improved quality by introducing the Ar gas to the interior of the chamber 11 along with the $C_2H_4$ gas and the $N_2$ gas. The use of the Ar gas and N₂ gas is not essential. If the Ar gas is introduced, the flow rate thereof is preferably within a range, e.g., from 100 to 2000 mL/min (sccm) and more preferably within a range from 300 to 1000 mL/min (sccm) from a viewpoint of efficiently growing the carbon nanotubes 58. Further, if the N₂ gas is introduced, the flow rate thereof is preferably within a range, e.g., from 100 to 1000 mL/min (sccm) and more preferably within a range from 100 to 300 mL/min (sccm) from a viewpoint of efficiently growing the carbon nanotubes 58.

The processing time is preferably within a range, e.g., from 10 minutes to 120 minutes and more preferably within a range from 30 minutes to 90 minutes from a viewpoint of growing the carbon nanotubes 58 up to a sufficient length while preventing the activity of the surfaces of the activated catalytic metal fine particles 57B from being lowered.

In forming the carbon nanotubes 58 using the thermal CVD method, the gas is not limited to the $C_2H_4$ gas and hydrocarbon gases such as $CH_4$, $C_2H_6$, $C_3H_8$, $C_3H_6$, $C_2H_2$ or the like, or carbon-containing gases such as $CH_3OH$, $C_2H_5OH$ or the like may be used instead of the $C_2H_4$ gas. Further, other noble gases, for example, He, Ne, Kr, or Xe may be used instead of the Ar gas. Further, in addition to the carbon-containing gas, for example, a reduction gas such as $H_2$, $NH_3$ or the like, or for example, an oxide gas such as $O_2$, $O_3$, $H_2O$, $N_2O$ or the like may be introduced simultaneously to the interior of the chamber 11, whereby the growth rate and the quality of the carbon nanotubes 58 can be increased.

In the thermal CVD method, the carbon nanotubes 58 grow maintaining the characteristics of the activated catalytic metal fine particles 57B. Accordingly, high-density carbon nanotubes 58 can be oriented approximately perpendicular to the surface of the wafer W using the activated catalytic metal fine particles 57B, made to have a high density and activated in the fine particle forming step S31 and the activation step S32, as nuclei. Further, since plasma is not generated in the thermal CVD method, damage by electrons or ions within the plasma does not occur on the carbon nanotubes 58. Further, since an introduction of crystal defects or impurities is suppressed, carbon nanotubes 58 having less impurities, a high G/D ratio, and excellent crystalline orientation can be formed.

Further, in the present embodiment, the carbon nanotubes 58 are formed by thermally decomposing the $C_2H_4$ gas using the thermal CVD method in the plasma CVD film forming apparatus 10. However, since the plasma CVD film forming apparatus 10 can also perform the plasma CVD method, a plasma CVD method may be used in the carbon nanotube forming step S33. Specifically, it may be possible that carbon plasma is generated from the $C_2H_4$ gas by microwaves and the carbon nanotubes 58 may be formed using the carbon plasma.

In order to prevent the surfaces of the activated catalytic metal fine particles 57B activated in the activation step S32 from being deactivated, the formation of the carbon nanotubes 58 in the carbon nanotube forming step S33 is preferably performed in succession to the activation step S32. Further, it is more preferable that the formation of the carbon nanotubes 58 in the carbon nanotube forming step S33 is continuously performed within the same chamber 11 as the chamber 11 at which the activation step S32 is performed.

Next, after the carbon nanotubes 58 are formed by sequentially performing the fine particle forming step S31 to the carbon nanotube forming step S33, the introduction of the microwaves is stopped and the supply of the gases is stopped. Further, after the pressure within the chamber 11 is adjusted, the gate valve 20 is open and the wafer W is unloaded from the chamber 11, thereby completing the present method.

In the method for growing carbon nanotubes according to the embodiment of the present disclosure, the catalytic metal layer 57 of the wafer W is micronized using the oxygen plasma. Further, when a number of catalytic metal fine particles 57A are formed through the micronization, the bias potential is generated on a surface of the wafer W. At this time, since the amount of ions within the oxygen plasma drawn to the catalytic metal layer 57 can be controlled by adjusting the bias potential, the amount of the thermal energy applied to the catalytic metal layer 57 by the ion flux can be controlled. As a result, as much energy that allows the atoms of catalytic metal to be agglomerated but not excessively agglomerated can be applied to the catalytic metal layer 57. Thus, a number of catalytic metal fine particles 57A of a nano-order size arranged in a high-density can be obtained.

The diameter of the carbon nanotube is dependent on the size of the catalytic metal fine particle and the carbon nanotubes are formed using the catalytic metal fine particle as the nuclei. That is, the tube number of formed carbon nanotubes corresponds to the number of catalytic metal fine particles. Accordingly, when a number of catalytic metal fine particles 57A of a nano-order size arranged in a high density are obtained as described above, ultra fine carbon nanotubes 58 of a high density, e.g., $1 \times 10^{12}$ tubes/cm² or more can be obtained.

The present disclosure is described using the aforementioned embodiment, but the present disclosure is not limited to the aforementioned embodiment.

For example, in the fine particle forming step S31 of the aforementioned embodiment, the catalytic metal fine particles 57A are formed by performing the oxygen plasma processing on the catalytic metal layer 57 through the introduction of the $O_2$ gas along with the Ar gas. However, it may be possible that the $O_2$ gas is not introduced and only argon plasma generated from the Ar gas is drawn toward the catalytic metal layer 57 by the high-frequency bias voltage to provide thermal energy of the ion flux of the argon plasma to the catalytic metal layer 57. At this time, since the migration of atoms of the surface in the catalytic metal layer 57 can also occur, the catalytic metal fine particles 57A can be formed. In this case, however, since an oxide film is not formed on the surface of the catalytic metal fine particles 57A, the effect of suppressing the agglomeration of the catalytic metal fine particles 57A by the oxide film can not be expected. Accordingly, it is preferable to adjust the applied high-frequency bias voltage such that the thermal energy of the ion flux provided to the catalytic metal layer 57 becomes smaller compared to the case using the oxygen plasma.

Further, it may be possible that an $H_2$ gas is introduced in the fine particle forming step S31 and hydrogen plasma is drawn toward the catalytic metal layer 57 by the high-frequency bias voltage to provide thermal energy of the ion flux of hydrogen plasma. Even in this case, since the migration of atoms of the surface in the catalytic metal layer 57 can also occur, the catalytic metal fine particles 57A can be formed. Further, since the same gas ($H_2$ gas) as that in the subsequent activation step S32 is used, the exhaust of the interior of the chamber 11 can be simplified and throughput can be improved. Even in this case, however, since an oxide film is not formed on the surface of the catalytic metal fine particles 57A, it is preferable to adjust the applied high-frequency bias voltage such that the thermal energy of the ion flux applied to the catalytic metal layer 57 becomes smaller compared to the case using the oxygen plasma.

Further, although the high-frequency bias voltage is applied to the wafer W in the fine particle forming step S31, a DC bias voltage may be applied to the wafer W by supplying DC power to the lower electrode 25 of the loading table 12. In this case, since the ions within the oxygen plasma can be also drawn toward the catalytic metal layer 57, the amount of ion flux from the oxygen plasma drawn onto the catalytic metal layer 57 can be controlled by adjusting the value of the applied DC bias voltage.

Further, the method for forming carbon nanotubes according to the present embodiment may include an arbitrary process in addition to the processes from the fine particle forming step S31 to the carbon nanotube forming step S33. For example, a process of purging the interior of the chamber 11 by flowing the Ar gas or $N_2$ gas after firstly rapidly exhausting the interior of the chamber 11 by the exhaust device 49 may be provided between the processes from the fine particle forming step S31 to the carbon nanotube forming step S33.

Further, although the method for forming carbon nanotubes according to the present embodiment is performed by the microwave-excited plasma type plasma CVD film forming apparatus 10 using the slot antenna, other microwave-excited plasma type plasma CVD film forming apparatuses may be used. Further, plasma processing apparatuses using other typed plasma such as inductively coupling plasma, capacitive coupling plasma or the like may be used.

Further, although the relative relation of the wafer temperature between the fine particle forming step S31, the activation step S32, and the carbon nanotube forming step S33 is not particularly limited, but, for example, it may be possible that the temperature of the wafer W in the activation step S32 and the carbon nanotube forming step S33 is set to be higher than the temperature of the wafer W in the fine particle forming step S31 to form the carbon nanotubes 58.

EXAMPLE

An example of the present disclosure is described below.

First, a wafer W in which a Co thin film (2 nm) as the catalytic metal layer 57 was formed on $TiN/SiO_2$ films as the base layers 55 and 56 by a sputtering method was loaded on the loading table 12. In the fine particle forming step S31, oxygen plasma was generated by introducing an $O_2$ gas into the chamber 11, the wafer W was heated to 470 degrees C., pressure within the chamber 11 was set to 2 Torr, and oxygen plasma processing was performed on the wafer W for 5 minutes. At this time, a high-frequency bias voltage of 75 W was applied to the wafer W.

Figure 6:
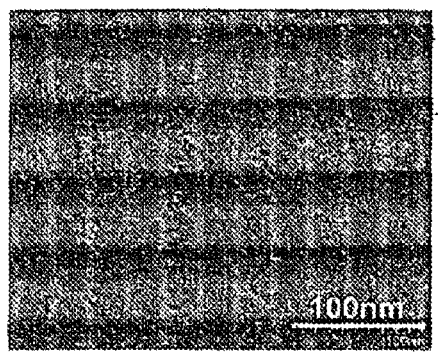
FIG. 6 is a high-resolution electrical microscope image of catalytic metal fine particles formed in an example of the present disclosure.

Further, a high-resolution electrical microscope image of the catalytic metal fine particles 57A formed when the high-frequency bias voltage applied to the wafer W in the aforementioned fine particle forming step S31 was changed into 35 W is illustrated in FIG. 6. In FIG. 6, the density of the catalytic metal fine particles 57A was about $2\times10^{12}$ tubes/cm$^2$.

Figure 7:
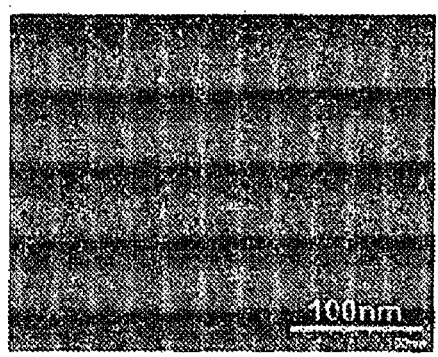
FIG. 7 is a high-resolution electrical microscope image of catalytic metal fine particles formed in a comparison example of the present disclosure.

A high-resolution electrical microscope image of the catalytic metal fine particles 57A formed when the high-frequency bias voltage was not applied to the wafer W in the aforementioned fine particle forming step S31 is illustrated in FIG. 7 (comparative example). In FIG. 7, the density of the catalytic metal fine particles 57A was about $6\times10^{11}$ tubes/cm$^2$.

Next, in the activation step S32, hydrogen plasma was generated by introducing $H_2/N_2$ gases into the chamber 11, the wafer W was maintained at 470 degrees C., pressure within the chamber 11 was set to 1 Torr, and hydrogen plasma processing was performed on the wafer W for 5 minutes. At this time, the high-frequency bias voltage was not applied to the wafer W.

Next, in the carbon nanotube forming step S33, a mixed gas of $C_2H_4/H_2$ was introduced into the interior of the chamber 11, carbon plasma was generated from the $C_2H_4$ gas by the microwaves, and carbon nanotubes 58 were formed by the plasma CVD method. At this time, the wafer W was maintained at 470 degrees C., pressure within the chamber 11 was set to 3 Torr, and carbon plasma processing was performed on the wafer W for 30 minutes.

Figure 8:
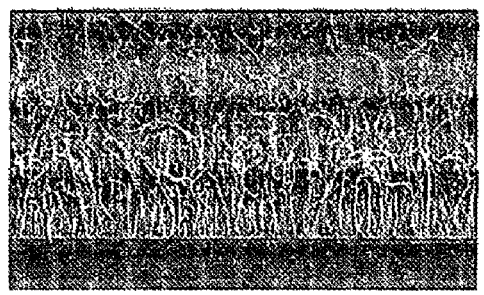
FIG. 8 is a high-resolution electrical microscope image of carbon nanotubes formed in the example of the present disclosure.

A high-resolution electrical microscope image of the carbon nanotubes 58 formed on the wafer W through a series of the aforementioned processes is illustrated in FIG. 8. In FIG. 8, an average diameter of the carbon nanotubes 58 was found to be 20 nm. Further, the average density was estimated to be half of the theoretical density from a comparison between a portion where bundles (bunch) of the carbon nanotubes 58 have been most densely grown, and a root portion of the carbon nanotubes 58. The density of the carbon nanotubes 58 was estimated to be $2\times10^{11}$ tubes/cm$^2$.

This application claims the benefit of Japanese Patent Application No. 2013-070187, filed on Mar. 28, 2013, in the Japan Patent Office, the disclosure of which is incorporated herein in its entirety by reference.

EXPLANATION OF REFERENCE NUMERALS

W: wafer
10: plasma CVD film forming apparatus
11: chamber
12: loading table
28: high-frequency power source
57: catalytic metal layer
57A: catalytic metal fine particles
57B: activated catalytic metal fine particle
58: carbon nanotube

What is claimed is:

1. A method for growing carbon nanotubes, comprising:
a fine particle forming process of forming catalytic metal fine particles by micronizing a catalytic metal layer using first plasma that is oxygen-containing gas plasma generated by microwave in a substrate including thereon the catalytic metal layer, so that an agglomeration of a plurality of atoms of catalytic metal is generated and the catalytic metal layer is changed into a number of catalytic metal fine particles;
an activation process of activating surfaces of the catalytic metal fine particles by reducing the surfaces of the catalytic metal fine particles using second plasma containing hydrogen atoms; and
a carbon nanotube forming process of forming the carbon nanotubes using the catalytic metal fine particles having the activated surfaces as nuclei,
wherein, in the fine particle forming process, the substrate including thereon the catalytic metal layer is loaded on a loading table and a high-frequency bias voltage is applied to the substrate via the loading table in the first plasma and a bias potential generated on a surface of the substrate is adjusted in order to control an amount of an ion flux and change the catalytic metal layer into the catalytic metal fine particles in the fine particle forming process, and
wherein, in the carbon nanotube forming process, a thermal CVD method is used.

2. The method of claim 1, wherein the first plasma includes at least argon atoms.

3. The method of claim 1, wherein in the carbon nanotube forming process, the high-frequency bias voltage is not applied.

4. The method of claim 1, wherein in the activation process, the high-frequency bias voltage is not applied.

5. The method of claim 1, wherein the fine particle forming process, the activation process, and the carbon nanotube forming process are sequentially and continuously performed.

* * * * *